(12) United States Patent
Kido et al.

(10) Patent No.: US 11,292,065 B2
(45) Date of Patent: Apr. 5, 2022

(54) CUTTING TOOL

(71) Applicant: SUMITOMO ELECTRIC HARDMETAL CORP., Itami (JP)

(72) Inventors: Yasuki Kido, Itami (JP); Susumu Okuno, Itami (JP); Fumiyoshi Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 17/255,032

(22) PCT Filed: Jun. 2, 2020

(86) PCT No.: PCT/JP2020/021748
§ 371 (c)(1),
(2) Date: Dec. 22, 2020

(65) Prior Publication Data
US 2021/0370410 A1    Dec. 2, 2021

(51) Int. Cl.
*B23B 27/14* (2006.01)
*C23C 28/00* (2006.01)
*C23C 16/34* (2006.01)
*C23C 16/02* (2006.01)

(52) U.S. Cl.
CPC ........ *B23B 27/148* (2013.01); *C23C 16/0281* (2013.01); *C23C 16/34* (2013.01); *C23C 28/347* (2013.01); *B23B 2224/24* (2013.01)

(58) Field of Classification Search
CPC ... B23B 27/14; B23B 27/148; B23B 2224/24; B23B 2228/105; C23C 16/36
USPC .......................................... 428/697, 698, 699
See application file for complete search history.

(56) References Cited

U.S. PATENT DOCUMENTS

2009/0123779 A1    5/2009 Endler

FOREIGN PATENT DOCUMENTS

| JP | H10-330914 A | 12/1998 |
|---|---|---|
| JP | 2001-38505 A | 2/2001 |
| JP | 2001-179503 A | 7/2001 |
| JP | 2002-239810 A | 8/2002 |
| JP | 2006-137982 A | 6/2006 |
| JP | 2006-263857 A | 10/2006 |
| JP | 2008-545063 A | 12/2008 |
| JP | 2009-6439 A | 1/2009 |
| JP | 2012-166321 A | 9/2012 |

*Primary Examiner* — Archene A Turner
(74) *Attorney, Agent, or Firm* — Faegre Drinker Biddle & Reath LLP (57) ABSTRACT

A cutting tool comprises a substrate and an AlTiN layer, the AlTiN layer including a first major surface and a second major surface, the AlTiN layer including a first region having a distance of 0 nm or more and 30 nm or less from the first major surface and having a maximum oxygen content ratio of more than 0 atomic % and less than 5 atomic %, a second region having a distance of more than 30 nm and 100 nm or less from the first major surface and having a maximum oxygen content ratio of 5 atomic % or more and 30 atomic % or less, and a third region having a distance of more than 100 nm and 150 nm or less from the first major surface and having a maximum oxygen content ratio of more than 0 atomic % and less than 5 atomic %.

5 Claims, 3 Drawing Sheets

CUTTING TOOL

TECHNICAL FIELD

The present disclosure relates to a cutting tool.

BACKGROUND ART

Conventionally, cutting tools made of cemented carbide or cubic boron nitride (cBN) sintered material have been used to cut steel, castings, and the like. When such a cutting tool is used to cut a workpiece the cutting tool has its cutting edge exposed to a severe environment such as high temperature and high stress, which invites wearing and chipping of the cutting edge.

Accordingly, suppressing wearing and chipping of the cutting edge is important in improving the cutting performance of the cutting tool and hence extending the life of the cutting tool.

For the purpose of improving a cutting tool's cutting performance (e.g., breaking resistance and wear resistance) a development of a coating for coating a surface of a substrate of cemented carbide, cBN sintered material and the like is underway. Inter alia, a coating composed of a compound of aluminum (Al), titanium (Ti), and nitrogen (N) (hereinafter also referred to as "AlTiN") can have high hardness and also enhance oxidation resistance (for example, see Japanese Patent Laid-Open No. 10-330914 (PTL 1)).

CITATION LIST

Patent Literature

PTL 1: Japanese Patent Application Laid-Open No. 10-330914

SUMMARY OF INVENTION

The presently disclosed cutting tool is a cutting tool comprising a substrate and an AlTiN layer disposed on the substrate, the AlTiN layer including cubic $Al_xTi_{(1-x)}N$ crystal grains,
an atomic ratio x of Al in the $Al_xTi_{(1-x)}N$ being 0.7 or more and 0.95 or less,
the AlTiN layer including a first major surface on a side of a surface of the cutting tool and a second major surface on a side of the substrate,
the AlTiN layer including a first region having a distance of 0 nm or more and 30 nm or less from the first major surface, a second region having a distance of more than 30 nm and 100 nm or less from the first major surface, and a third region having a distance of more than 100 nm and 150 nm or less from the first major surface,
the first region having a maximum oxygen content ratio of more than 0 atomic % and less than 5 atomic %,
the second region having a maximum oxygen content ratio of 5 atomic % or more and 30 atomic % or less,
the third region having a maximum oxygen content ratio of more than 0 atomic % and less than 5 atomic %.

DETAILED DESCRIPTION

[Problem to be Solved by the Present Disclosure]

In recent years, a cutting tool having a long tool life has also been demanded for a more efficient cutting process. Under a condition in which boundary failure easily occurs, in particular, there is a demand for a cutting tool excellent in oxidation resistance and wear resistance.

Advantageous Effect of the Present Disclosure

The presently disclosed cutting tool can also have a long tool life even under a condition in which boundary failure easily occurs, in particular.

Description of Embodiments of the Present Disclosure

Initially, embodiments of the present disclosure will be listed and described.

(1) The presently disclosed cutting tool is
a cutting tool comprising a substrate and an AlTiN layer disposed on the substrate,
the AlTiN layer including cubic $Al_xTi_{(1-x)}N$ crystal grains,
an atomic ratio x of Al in the $Al_xTi_{(1-x)}N$ being 0.7 or more and 0.95 or less,
the AlTiN layer including a first major surface on a side of a surface of the cutting tool and a second major surface on a side of the substrate,
the AlTiN layer including a first region having a distance of 0 nm or more and 30 nm or less from the first major surface, a second region having a distance of more than 30 nm and 100 nm or less from the first major surface, and a third region having a distance of more than 100 nm and 150 nm or less from the first major surface,
the first region having a maximum oxygen content ratio of more than 0 atomic % and less than 5 atomic %,
the second region having a maximum oxygen content ratio of 5 atomic % or more and 30 atomic % or less,
the third region having a maximum oxygen content ratio of more than 0 atomic % and less than 5 atomic %.
The presently disclosed cutting tool can also have a long tool life even under a condition in which boundary failure easily occurs, in particular.

(2) The second region preferably has a maximum oxygen content ratio of 6 atomic % or more and 30 atomic % or less. The presently disclosed cutting tool can thus have a long tool life.

(3) The AlTiN layer preferably has a thickness of 0.1 μm or more and 20 μm or less. The presently disclosed cutting tool can thus have a longer tool life.

(4) Preferably, the cutting tool further comprises an underlying layer disposed between the substrate and the AlTiN layer, wherein
the underlying layer is composed of a first compound consisting of at least one element selected from the group consisting of a group 4 element, a group 5 element and a group 6 element of the periodic table and Al and at least one element selected from the group consisting of carbon, nitrogen, oxygen and boron.

This can enhance the AlTiN layer in peeling resistance.

(5) Preferably, the cutting tool further comprises a surface layer disposed on the AlTiN layer, wherein the surface layer is composed of a second compound consisting of at least one element selected from the group consisting of a group 4 element, a group 5 element and a group 6 element of the periodic table and Al and at least one element selected from the group consisting of carbon, nitrogen, oxygen and boron.

The presently disclosed cutting tool can thus have a further longer tool life.

Detailed Description of Embodiments of the Present Disclosure

A specific example of the present disclosed cutting tool will now be described below with reference to the drawings. In the drawings of the present disclosure, like reference numerals denote like or equivalent components. Furthermore, in the drawings, length, width, thickness, depth and other similar dimensional relationships are changed as appropriate for clarification and simplification of the drawings, and may not represent actual dimensional relationships.

In the present specification, an expression in the form of "A to B" means a range's upper and lower limits (that is, A or more and B or less), and when A is not accompanied by any unit and B is alone accompanied by a unit, A has the same unit as B.

In the present specification, when a compound or the like is represented by a chemical formula without specifying any specific atomic ratio, it shall include any conventionally known atomic ratio and should not necessarily be limited to what falls within a stoichiometric range. For example, "AlTiN" has a ratio in atomicity including any conventionally known atomic ratio.

First Embodiment: Cutting Tool

The presently disclosed cutting tool is
a cutting tool comprising a substrate and an AlTiN layer disposed on the substrate,
the AlTiN layer including cubic $Al_xTi_{(1-x)}N$ crystal grains, an atomic ratio x of Al in the $Al_xTi_{(1-x)}N$ being 0.7 or more and 0.95 or less,
the AlTiN layer including a first major surface on a side of a surface of the cutting tool and a second major surface on a side of the substrate,
the AlTiN layer including a first region having a distance of 0 nm or more and 30 nm or less from the first major surface, a second region having a distance of more than 30 nm and 100 nm or less from the first major surface, and a third region having a distance of more than 100 nm and 150 nm or less from the first major surface,
the first region having a maximum oxygen content ratio of more than 0 atomic % and less than 5 atomic %,
the second region having a maximum oxygen content ratio of 5 atomic % or more and 30 atomic % or less,
the third region having a maximum oxygen content ratio of more than 0 atomic % and less than 5 atomic %.

The presently disclosed cutting tool can also have a long tool life even under a condition in which boundary failure easily occurs, in particular. Although why it can do so is not known, it is inferred as indicated by items (i) and (ii) below:

(i) In the presently disclosed cutting tool, the AlTiN layer has a maximum oxygen content ratio of more than 0 atomic % and less than 5 atomic % in the first region located on a side of an outermost surface thereof. The first region thus has appropriate hardness and appropriate wear resistance. Thus, the cutting tool is less likely to be excessively worn or broken when it starts cutting, and the cutting tool can thus have a long tool life.

(ii) In the presently disclosed cutting tool, the AlTiN layer has a maximum oxygen content ratio of 5 atomic % or more and 30 atomic % or less in the second region. The second region thus has high hardness and excellent wear resistance.

Furthermore, the second region has excellent oxidation resistance, which suppresses boundary failure. The cutting tool can thus have a long tool life.

(iii) In the presently disclosed cutting tool, the AlTiN layer has a maximum oxygen content ratio of more than 0 atomic % and less than 5 atomic % in the third region. The third region thus has appropriate hardness and appropriate wear resistance. The cutting tool can thus have a long tool life.

<Configuration of Cutting Tool>

Figure 1:
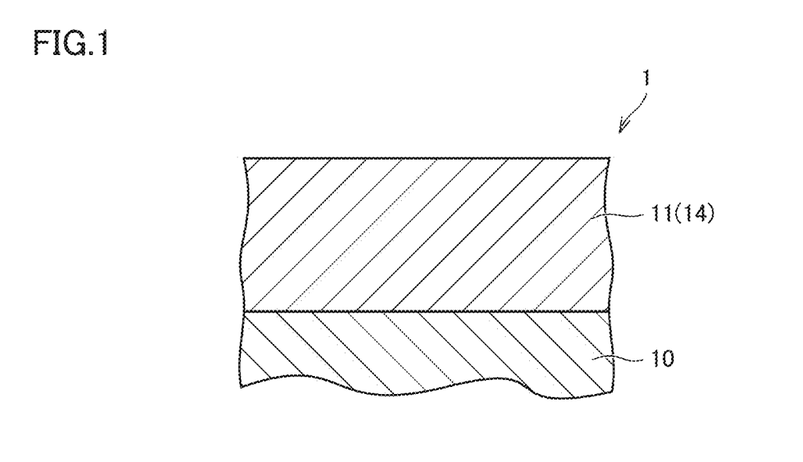
FIG. 1 illustrates an example of a cutting tool according to a first embodiment.

As shown in FIG. 1, a cutting tool 1 of the present embodiment comprises a substrate 10, and an AlTiN layer 11 disposed on substrate 10 (hereinafter also simply referred to as a "cutting tool").

Figure 2:
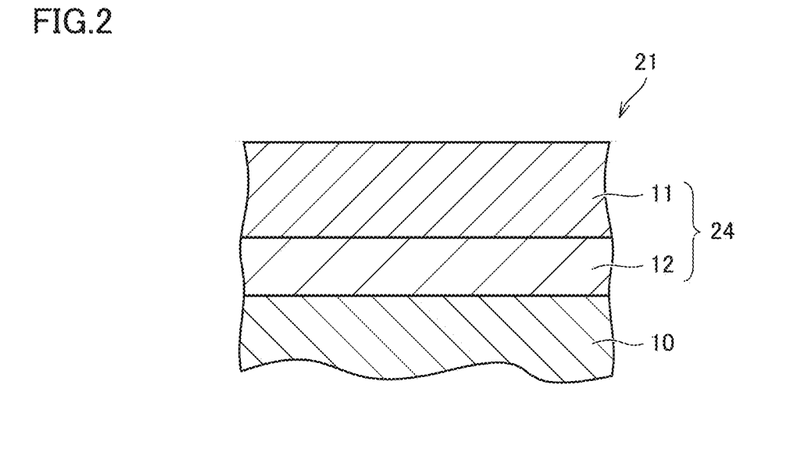
FIG. 2 illustrates another example of the cutting tool according to the first embodiment.

As shown in FIG. 2, a cutting tool 21 may further comprise an underlying layer 12 disposed between substrate 10 and AlTiN layer 11.

Figure 3:
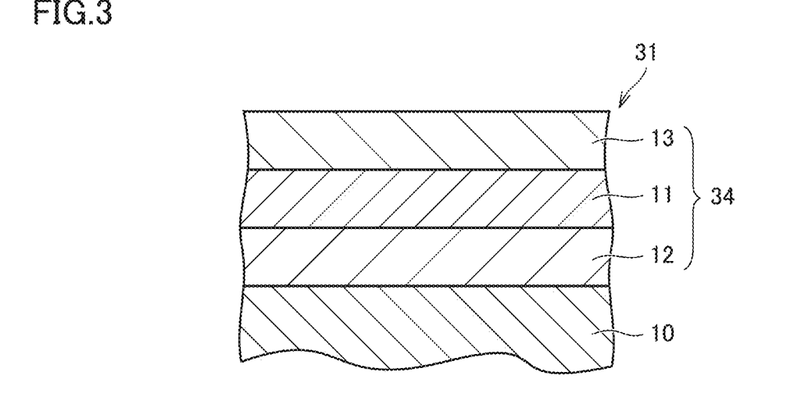
FIG. 3 illustrates still another example of the cutting tool according to the first embodiment.

As shown in FIG. 3, a cutting tool 31 may further comprise a surface layer 13 disposed on AlTiN layer 11. Other layers such as underlying layer 12 and surface layer 13 will be described hereinafter.

In the present specification, the above-described layers disposed on substrate 10 may be collectively referred to as a "coating." That is, as shown in FIGS. 1 to 3, cutting tools 1, 21 and 31 comprise coatings 14, 24 and 34 disposed on substrate 10, and the coatings include AlTiN layer 11. Further, as shown in FIGS. 2 and 3, coatings 24 and 34 may further include underlying layer 12 and/or surface layer 13.

<Applications of Cutting Tool>

The cutting tool can for example be a drill, an end mill (e.g., a ball end mill), an indexable cutting insert for a drill, an indexable cutting insert for an end mill, an indexable cutting insert for milling, an indexable cutting insert for turning, a metal saw, a gear cutting tool, a reamer, a tap, or the like.

<Substrate>

The substrate of the present embodiment can be any substrate conventionally known as a substrate of this type. For example, it preferably includes at least one selected from the group consisting of a cemented carbide (for example, a tungsten carbide (WC)-base cemented carbide, a cemented carbide containing WC and Co, a cemented carbide containing WC and a carbonitride of Cr, Ti, Ta, Nb or the like, and the like), a cermet (mainly composed of TiC, TiN, TiCN, or the like), a high-speed steel, ceramics (titanium carbide, silicon carbide, silicon nitride, aluminum nitride, aluminum oxide, and the like), a cubic boron nitride (cBN) sintered material, and a diamond sintered material.

Of these various types of substrates, it is particularly preferable to select a cemented carbide (a WC-base cemented carbide, in particular) or a cermet (a TiCN-base cermet, in particular). This is because these substrates are particularly excellent in balance between hardness and strength at high temperature, in particular, and present excellent characteristics as a substrate for a cutting tool for the above-described applications.

When using a cemented carbide as a substrate, the effect of the present embodiment is exhibited even if the cemented carbide has a structure including free carbon or an extraordinary phase referred to as η phase. Note that the substrate used in the present embodiment may have its surface modified. For example, for the cemented carbide, the surface may be provided with a β-free layer, and for the cermet, the surface may be provided with a surface hardened layer, and even if the surface is modified in this way, the effect of the present embodiment is exhibited.

<Coating>

A coating according to the present embodiment includes an AlTiN layer disposed on the substrate. The "coating" coats at least a part of the substrate (for example, a rake face, a flank, and the like) to exhibit a function to improve the cutting tool's various characteristics such as breaking resistance, wear resistance, peeling resistance and the like. The coating is preferably applied not only to a part of the substrate but also to the entire surface of the substrate. However, even if the substrate is partially uncoated with the coating or the coating is partially different in configuration, such does not depart from the scope of the present embodiment.

The coating's thickness is preferably 2.5 μm or more and 30 μm or less, more preferably 3 μm or more and 25 μm or less. Note that the thickness of the coating means a total thickness of any layers constituting the coating. A "layer constituting the coating" for example includes an AlTiN layer, an underlying layer, a surface layer and the like, as will be described hereinafter.

Each layer configuring the coating is measured in thickness by observing with a scanning transmission electron microscope (STEM) a sample in a cross section parallel to the direction of a normal to a surface of the substrate, for example. The scanning transmission electron microscope is JEM-2100F (trade name) manufactured by JEOL Ltd., for example.

As used herein, "thickness" means an average thickness. Specifically, a sample in cross section is observed with a magnification of 5,000 to 10,000 times in an area of 100 to 500 μm², and in one field of view, 10 locations are subject to measurement in thickness in width and their average value is determined as "thickness."

<AlTiN Layer>

The AlTiN layer of the present embodiment includes cubic crystal grains (hereinafter also simply referred to as "crystal grains"). That is, the AlTiN layer is a layer including polycrystalline $Al_xTi_{1-x}N$. In the present embodiment, "crystal grains of $Al_xTi_{1-x}N$" mean crystal grains each of a composite crystal formed of a layer made of AlN (hereinafter also referred to as an "AlN layer") and a layer made of TiN (hereinafter also referred to as a "TiN layer") alternately stacked. In the present embodiment, the AlN layer also includes a layer having a portion with Al substituted with Ti. Further, the TiN layer also includes a layer having a portion with Ti substituted with Al.

For cubic $Al_xTi_{1-x}N$ crystal grains, the AlN layer and the TiN layer both have an FCC structure (Face-Centered Cubic structure).

An atomic ratio x of Al in the $Al_xTi_{1-x}N$ is 0.7 or more and 0.95 or less, preferably 0.8 or more and 0.9 or less.

The x is determined by analyzing crystal grains in the AlTiN layer appearing in a sample in a cross section parallel to the direction of a normal to a surface of the substrate with an energy dispersive X-ray (EDX) spectrometer accompanying a scanning electron microscope (SEM) or a TEM. The atomic ratio x of Al thus determined is a value determined as an average of all of the crystal grains of the $Al_xTi_{1-x}N$. Specifically, any 10 points in the AlTiN layer in a sample in the above-described cross section is each measured to obtain a value x, and an average value of such values obtained at the 10 points is defined as x in the $Al_xTi_{1-x}N$. Herein, "any 10 points" are selected from different crystal grains of the AlTiN layer. The EDX device is JED-2300 (trade name) manufactured by JEOL Ltd., for example. Not only the atomic ratio of Al but those of Ti and N can also be calculated in the above method.

In the present embodiment, being "disposed on the substrate" is not limited to being disposed directly on the substrate and also includes being disposed on the substrate via another layer. That is, the AlTiN layer may be disposed directly on the substrate or may be disposed on the substrate via another layer such as an underlying layer described hereinafter insofar as such does not impair an effect of the surface-coated cutting tool according to the present embodiment.

On the AlTiN layer, another layer such as a surface layer may be disposed. The AlTiN layer may be an outermost surface layer of the coating.

Figure 4:
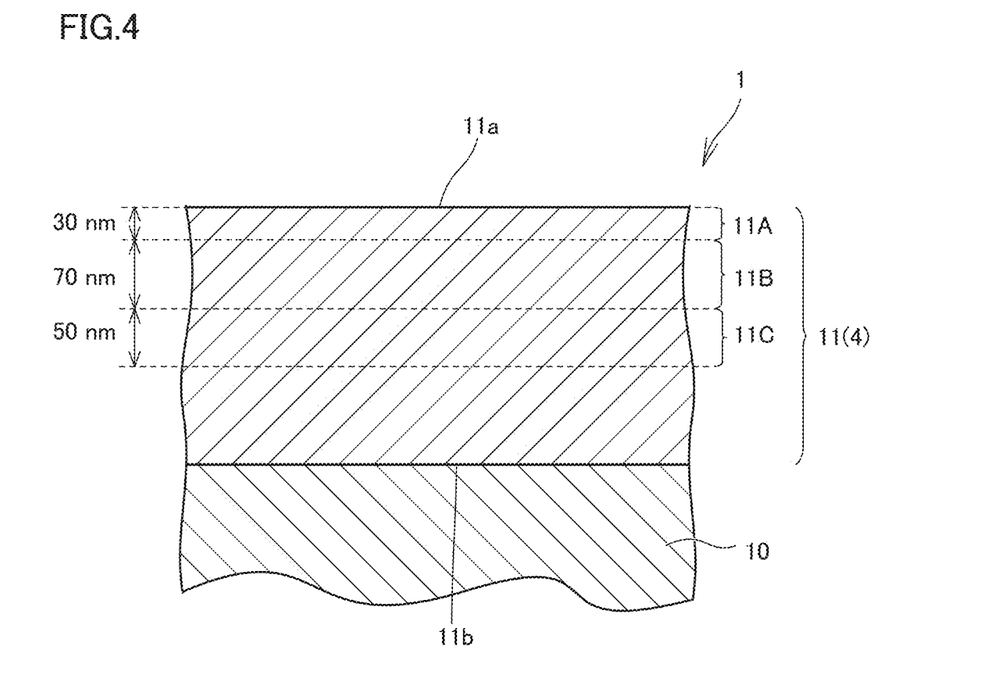
FIG. 4 illustrates an AlTiN layer of the cutting tool according to the first embodiment.

As shown in FIG. 4, AlTiN layer 11 includes a first major surface 11a on a side of a surface of cutting tool 1 and a second major surface 11b on a side of substrate 10. AlTiN layer 11 includes a first region 11A having a distance of 0 nm or more and 30 nm or less from first major surface 11a, a second region 11B having a distance of more than 30 nm and 100 nm or less from first major surface 11a, and a third region 11C having a distance of more than 100 nm and 150 nm or less from first major surface 11a.

the AlTiN layer of the present embodiment includes oxygen. The oxygen is believed to be present between a crystal lattice configuring the AlTiN layer.

The AlTiN layer of the present embodiment has a maximum oxygen content ratio of more than 0 atomic % and less than 5 atomic % in the first region located on a side of an outermost surface thereof. The first region thus has appropriate hardness and appropriate wear resistance. Thus, the cutting tool is less likely to be excessively worn or broken when it starts cutting, and the cutting tool can thus have a long tool life.

The first region has the maximum oxygen content ratio with a lower limit of more than 0 atomic %, and the lower limit can be 1 atomic % or more, 2 atomic % or more. The first region has the maximum oxygen content ratio with an upper limit of less than 5 atomic %, and the upper limit can be 4.5 atomic % or less, 4 atomic % or less. The first region can have a maximum oxygen content ratio of more than 0 atomic % and less than 5 atomic %, 1 atomic % or more and 4.5 atomic % or less, 2 atomic % or more and 4 atomic % or less.

In the present specification, the AlTiN layer's oxygen content ratio (as converted to $SiO_2$) is measured while etching a surface of a diamond layer using an Auger electron spectrometer (AES) (device: PHI 650® produced by Perkin-Elmer) in accordance with JIS K 0146:2002 (ISO 14606: 2000) while etching the AlTiN layer in the direction of a normal to the first major surface.

The etching is performed in a direction from the first major surface toward the second major surface (hereinafter also referred to as a "depthwise direction") in the direction of a normal to the first major surface. The oxygen content ratio is measured at points at intervals of 1 nm in the depthwise direction of the AlTiN layer. Thus, the oxygen content ratio can be measured at intervals of 1 nm in the depthwise direction of the AlTiN layer.

The Auger electron spectroscopic measurement is conducted under the following conditions:
Electron Energy: 10 kv
Electron beam current: 3 mA
Angle of incidence: 90°
(Detector: 55°)
Beam diameter: 1 nm
Sputter Ion: Ar
Mode: Depth Analysis (Depth Profile)

Note that, as measured by the applicant, it has been confirmed that, as measured in the same sample, while the AlTiN layer's oxygen content ratio was measured a plurality of times while where it was measured was changed, measurement results were obtained without substantial variation and there was no arbitrariness even when where it was measured was set as desired. Where it is measured can for example be the cutting tool's rake face, cutting edge, or the like.

The second region has a maximum oxygen content ratio of 5 atomic % or more and 30 atomic % or less. The second region thus has high hardness and excellent wear resistance. Furthermore, the second region has excellent oxidation resistance, which suppresses boundary failure. The cutting tool can thus have a long tool life.

The second region can have the maximum oxygen content ratio with a lower limit of 5 atomic % or more, 6 atomic % or more, 7 atomic % or more. The second region has the maximum oxygen content ratio with an upper limit of 30 atomic % or less and the upper limit can be 29.5 atomic % or less, 29 atomic % or less. The second region can have a maximum oxygen content ratio of 5 atomic % or more and 30 atomic % or less, 6 atomic % or more and 30 atomic % or less, 7 atomic % or more and 30 atomic % or less, 6 atomic % or more and 29.5 atomic % or less, 7 atomic % or more and 29 atomic % or less.

The third region has a maximum oxygen content ratio of more than 0 atomic % and less than 5 atomic %. The third region thus has appropriate hardness and appropriate wear resistance. The cutting tool can thus have a long tool life.

The third region can have the maximum oxygen content ratio with a lower limit of more than 0 atomic %, 0.5 atomic % or more, 1 atomic % or more. The third region has the maximum oxygen content ratio with an upper limit of less than 5 atomic %, and the upper limit can be 4.5 atomic % or less, 4 atomic % or less. The third region can have a maximum oxygen content ratio of more than 0 atomic % and less than 5 atomic %, 0.5 atomic % or more and 4.5 atomic % or less, 1 atomic % or more and 4 atomic % or less.

The AlTiN layer preferably has a thickness of 0.1 μm or more and 20 μm or less.

The cutting tool can thus have a longer tool life.

The AlTiN layer can have a lower limit in thickness of 0.1 μm or more, 1 μm or more. The AlTiN layer can have an upper limit in thickness of 20 μm or less, 10 μm or less. The AlTiN layer can be 0.1 μm or more and 20 μm or less, 1 μm or more and 10 μm or less in thickness.

The AlTiN layer's thickness can be determined by observing a sample in cross section of the cutting tool with a scanning transmission electron microscope (STEM) or the like, as has been described above.

<Underlying Layer>

As shown in FIGS. 2 and 3, cutting tools 21 and 31 comprise coatings 24 and 34, respectively, which can further include underlying layer 12 disposed between substrate 10 and AlTiN layer 11. Underlying layer 12 is preferably composed of a first compound consisting of at least one element selected from the group consisting of a group 4 element, a group 5 element and a group 6 element of the periodic table and Al and at least one element selected from the group consisting of carbon, nitrogen, oxygen and boron. Examples of the group 4 element of the periodic table include titanium (Ti), zirconium (Zr), hafnium (Hf), and the like. Examples of the group 5 element of the periodic table include vanadium (V), niobium (Nb), tantalum (Ta), and the like. Examples of the group 6 element of the periodic table include chromium (Cr), molybdenum (Mo), tungsten (W), and the like.

The first compound is different in composition from the AlTiN layer. That is, when the first compound is AlTiN, the first compound has a composition different from $Al_xTi_{(1-x)}N$ constituting the AlTiN layer.

The underlying layer is preferably composed of a first compound represented by TiCN. The underlying layer composed of TiCN exhibits strong adhesion to the AlTiN layer. As a result, the coating is enhanced in peeling resistance.

The underlying layer can have a lower limit in thickness of 0.1 μm or more, 1 μm or more, 1.5 μm or more. The underlying layer can have an upper limit in thickness of 20 μm or less, 15 μm or less, 10 μm or less. The underlying layer can be 0.1 μm or more and 20 μm or less, 1 μm or more and 15 μm or less, 1.5 μm or more and 10 μm or less in thickness.

The underlying layer's thickness can be determined by observing a sample in cross section of the cutting tool with a scanning transmission electron microscope (STEM) or the like, as has been described above.

<Surface Layer>

As shown in FIG. 3, cutting tool 31 comprises coating 34 which can further include surface layer 13 disposed on AlTiN layer 11. Surface layer 13 is composed of a second compound consisting of at least one element selected from the group consisting of a group 4 element, a group 5 element and a group 6 element of the periodic table and Al and at least one element selected from the group consisting of carbon, nitrogen, oxygen and boron.

The second compound is different in composition from the AlTiN layer. That is, when the second compound is AlTiN, the second compound has a composition different from $Al_xTi_{(1-x)}N$ constituting the AlTiN layer.

Examples of the second compound include $Al_2O_3$ and TiN.

The surface layer can have a lower limit in thickness of 0.1 μm or more, 0.2 μm or more. The surface layer can have an upper limit in thickness of 3 μm or less, 2 μm or less, 1 μm or less. The surface layer can be 0.1 μm or more and 3 μm or less, 0.2 μm or more and 2 μm or less, 0.2 μm or more and 1 μm or less in thickness.

The surface layer's thickness can be determined by observing a sample in cross section of the cutting tool with a scanning transmission electron microscope (STEM) or the like, as has been described above.

<Another Layer>

The coating of the cutting tool may further include another layer insofar as it does not impair an effect of the cutting tool according to the present embodiment. The other layer may have a composition different from or identical to that of the AlTiN layer, the underlying layer, or the surface layer. Examples of a compound included in the other layer include TiN, TiCN, TiBN, and $Al_2O_3$. The other layer is not limited, either, in in what order it is stacked. For example, an example of the other layer is an intermediate layer disposed between the underlying layer and the AlTiN layer.

While the other layer is not particularly limited in thickness as long as it does not impair an effect of the present embodiment, it is for example 0.1 μm or more and 20 μm or less.

Second Embodiment: A Method for Manufacturing a Cutting Tool

While a method for manufacturing a cutting tool according to the first embodiment is not particularly limited, it for example comprises a first step of preparing the substrate (hereinafter also simply referred to as a "first step"), and a second step of depositing a coating including the AlTiN layer on the substrate through chemical vapor deposition (CVD) (hereinafter also simply referred to as a "second step"). The method for manufacturing the cutting tool according to the present embodiment can further comprise a third step of blasting the coating (hereinafter also referred to as a "third step"). An example of the method for manufacturing the cutting tool according to the first embodiment will be described below. Note that the following manufacturing method is an example, and the method of manufacturing the cutting tool according to the first embodiment is not limited to the following method and the cutting tool may be manufactured in a different method.

<First Step: Step of Preparing a Substrate>

In the first step, a substrate is prepared. For example, a cemented carbide substrate, a cermet substrate or the like is prepared as the substrate. The cemented carbide substrate may be a commercially available product or may be manufactured in a typical powder metallurgy method. When the substrate is manufactured in a typical powder metallurgy method, for example, WC powder and Co powder or the like are mixed using a ball mill or the like to obtain a powdery mixture. After the powdery mixture is dried, it is shaped into a prescribed shape to obtain a shaped body. The shaped body is sintered to obtain a WC—Co based cemented carbide (a sintered material).

Subsequently, the sintered material can be honed or subjected to a prescribed cutting edge process to prepare a substrate made of the WC—Co based cemented carbide. In the first step, any other substrate may be prepared insofar as it is a substrate conventionally known as a substrate of this type.

<Second Step: Step of Forming an AlTiN Layer>

In the second step, a first gas, a second gas and a third gas are jetted onto the substrate in an atmosphere of 650° C. or higher and 800° C. or lower and 2 kPa or higher and 30 kPa or lower, the first gas including a gas of a halide of aluminum, a gas of a halide of titanium, carbon monoxide, carbon dioxide, and methanol, the second gas including a gas of a halide of aluminum, a gas of a halide of titanium and a gas of ammonia, the third gas including a gas of ammonia. The second step can be performed using, for example, a CVD apparatus described below.

(CVD Apparatus)

Figure 5:
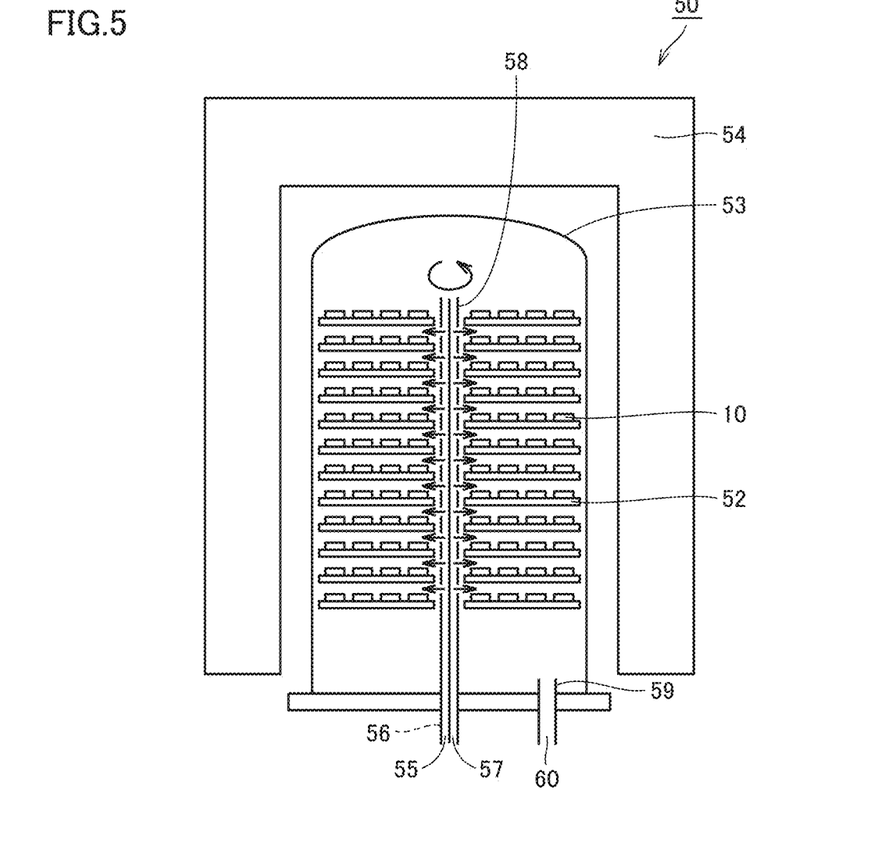
FIG. 5 is a schematic cross section of a CVD apparatus used for manufacturing a cutting tool according to a second embodiment.

FIG. 5 is a schematic cross section of one example of a CVD apparatus used for manufacturing the cutting tool according to the present embodiment. As shown in FIG. 5, a CVD apparatus 50 includes a plurality of substrate setting jigs 52 for setting substrate 10, and a reaction chamber 53 made of heat-resistant alloy steel and incorporating substrate setting jigs 52 therein. A temperature controller 54 is provided around reaction chamber 53 for controlling the temperature inside reaction chamber 53. In the present embodiment, substrate 10 is set on a protrusion which substrate setting jig 52 is provided with. Such a setting allows deposition to be done on a rake face, a flank, and a cutting edge portion uniformly.

Figure 6:
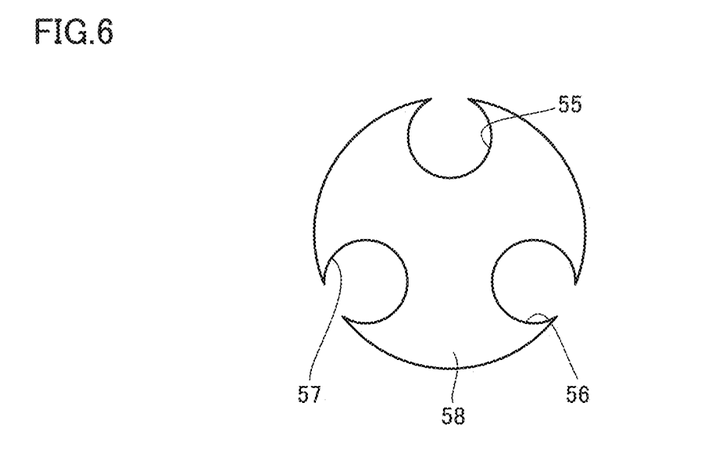
FIG. 6 is a schematic cross section of a gas introduction pipe of the CVD apparatus of FIG. 5.

A gas introduction pipe 58 having a first gas introduction pipe 55, a second gas introduction pipe 56 and a third gas introduction pipe 57 adjacently bonded together extends in the vertical direction through a space inside reaction chamber 53 rotatably about the vertical direction. Gas introduction pipe 58 is configured such that the first gas introduced into first gas introduction pipe 55, the second gas introduced into second gas introduction pipe 56, and the third gas introduced into third gas introduction pipe 57 are not mixed together inside gas introduction pipe 58 (see FIG. 6). Further, first gas introduction pipe 55, second gas introduction pipe 56, and third gas introduction pipe 57 are each provided with a plurality of throughholes for jetting the gases respectively flowing through first, second and third gas introduction pipes 55, 56 and 57 onto substrate 10 set on substrate setting jig 52. In the present embodiment, it is preferable that the gas jetting throughhole and substrate 10 be spaced by a sufficient distance. This allows the first gas, the second gas, and the third gas to flow uniformly and can thus prevent turbulence.

Further, reaction chamber 53 is provided with a gas exhaust pipe 59 for externally exhausting the gas inside reaction chamber 53, and the gas in reaction chamber 53 passes through gas exhaust pipe 59 and is exhausted out of reaction chamber 53 via a gas exhaust port 60.

More specifically, the first gas, the second gas and the third gas are introduced into first gas introduction pipe 55, second gas introduction pipe 56 and third gas introduction pipe 57, respectively. In doing so, the first, second and third gases in their respective gas introduction pipes may have any temperature that does not liquefy the gases. Subsequently, the first gas, the second gas and the third gas are jetted in this order repeatedly into reaction chamber 53 with an atmosphere set therein to have a temperature of 650° C. or higher and 800° C. or lower and a pressure of 2 kPa or higher and 30 kPa or lower. As gas introduction pipe 58 has the plurality of throughholes, the first, second, and third gases introduced are jetted into reaction chamber 53 through different throughholes, respectively. While the gases are thus jetted, gas introduction pipe 58 is rotating at a rotation speed for example of 2 to 4 rpm about the above-described axis, as indicated in FIG. 5 by a rotating arrow. As a result, the first gas, the second gas, and the third gas can be jetted in this order repeatedly onto substrate 10.

(First Gas)

The first gas includes a gas of a halide of aluminum, a gas of a halide of titanium, carbon monoxide, carbon dioxide, and methanol.

Examples of the gas of a halide of aluminum include a gas of aluminum chloride (a gas of $AlCl_3$ and a gas of $Al_2Cl_6$). Preferably, a gas of $AlCl_3$ is used. The gas of a halide of aluminum preferably has a concentration (% by volume) of 0.1% by volume or more and 20% by volume or less with reference to the total volume of the first gas.

Examples of the gas of a halide of titanium include a gas of titanium (IV) chloride (a gas of $TiCl_4$), a gas of titanium (III) chloride (a gas of $TiCl_3$), and the like. Preferably a gas of titanium (IV) chloride is used. The gas of a halide of titanium preferably has a concentration (in % by volume) of 0.1% by volume or more and 20% by volume or less with reference to the total volume of the first gas.

In the first gas, the gas of a halide of aluminum has a molar ratio more preferably of 0.1 or more and 0.9 or less with reference to the total moles of the gas of a halide of aluminum and the gas of a halide of titanium.

Carbon monoxide, carbon dioxide, and methanol preferably have a concentration (in % by volume) of 0.1% by volume or more and 20% by volume or less with reference to the total volume of the first gas.

The first gas may include a gas of hydrogen and may include an inert gas such as a gas of argon. The inert gas preferably has a concentration (in % by volume) of 10% by volume or more and 60% by volume or less with reference to the total volume of the first gas. The gas of hydrogen typically occupies the balance of the first gas.

The first gas is jetted onto the substrate at a flow rate preferably of 5 to 60 L/min.

(Second Gas)

The second gas includes a gas of a halide of aluminum, a gas of a halide of titanium, and a gas of ammonia. The gas of a halide of aluminum and the gas of a halide of titanium can be the gases exemplified in the above (First Gas) section. The gas of a halide of aluminum and the gas of a halide of titanium that are used for the first gas may be identical to or different from the gas of a halide of aluminum and the gas of a halide of titanium that are used for the second gas, respectively.

The gas of a halide of aluminum preferably has a concentration (% by volume) of 2% by volume or more and 50% by volume or less with reference to the total volume of the second gas.

The gas of a halide of titanium preferably has a concentration (in % by volume) of 0.1% by volume or more and 20% by volume or less with reference to the total volume of the second gas.

In the second gas, the gas of a halide of aluminum has a molar ratio preferably of 0.1 or more and 0.9 or less with reference to the total moles of the gas of a halide of aluminum and the gas of a halide of titanium.

The gas of ammonia preferably has a concentration (in % by volume) of 0.1% by volume or more and 20% by volume or less with reference to the total volume of the second gas.

The second gas may include a gas of hydrogen and may include an inert gas such as a gas of argon. The inert gas preferably has a concentration (in % by volume) of 0.1% by volume or more and 20% by volume or less with reference to the total volume of the second gas. The gas of hydrogen typically occupies the balance of the second gas.

The second gas is jetted onto the substrate at a flow rate preferably of 5 to 60 L/min.

(Third Gas)

The third gas includes a gas of ammonia. The third gas may include a gas of hydrogen and may include an inert gas such as a gas of argon.

The gas of ammonia preferably has a concentration (in % by volume) of 0.1% by volume or more and 40% by volume or less with reference to the total volume of the third gas. The gas of hydrogen typically occupies the balance of the third gas.

The third gas is jetted onto the substrate at a flow rate preferably of 5 to 20 L/min.

<Third Step: Blasting Step>

In the present step, the coating is blasted. The blasting is performed for example under the following conditions. The blasting allows compressive residual stress to be imparted to the coating.

(Blasting Conditions)
Medium: 500 g of zirconia particles
Projection angle: 90°
Projection distance: 50 mm
Projection time: 3 seconds <Another Step>

In the manufacturing method according to the present embodiment, in addition to the steps described above, an additional step may be performed, as appropriate, within a range that does not impair an effect of the present embodiment. Examples of the additional step include the step of forming an underlying layer between the substrate and the AlTiN layer, and the step of forming a surface layer on the AlTiN layer. The underlying layer and the surface layer may be formed in any method, and the layers are formed for example through CVD. When the step of forming the surface layer on the AlTiN layer is performed, the third step is performed after the surface layer is formed.

In the method for manufacturing a surface-coated cutting tool according to the present embodiment, the AlTiN layer is formed through CVD. When this is compared with forming the coating through PVD, the former enhances the coating's adhesion to the substrate (or coating adhesion).

EXAMPLES

The present embodiment will be described more specifically with reference to examples. Note, however, that the present embodiment is not limited to these examples.

<<Manufacturing a Cutting Tool>>
<Preparing the Substrate>

Initially, as a substrate, a substrate composed of cemented carbide indicated in Table 1 below (hereinafter also simply referred to as a "substrate") was prepared (i.e., a first step). Powdery raw materials of a blending composition (% by mass) shown in Table 1 were uniformly mixed to provide a powdery mixture. In Table 1, "balance" indicates that WC occupies the balance of the blending composition (% by mass).

TABLE 1

| substrate's blending composition (mass %) | | |
|---|---|---|
| Co | TaC | WC |
| 6.0 | 0.2 | balance |

Subsequently, the powdery mixture was pressure-formed into a prescribed shape and thereafter sintered for 1 to 2 hours at 1300 to 1500° C. to obtain a substrate (substrate shape: CNMG120408 N-GU).

<Depositing the Coating>

Subsequently, the CVD apparatus shown in FIG. 5 was employed to deposit on the substrate a coating including an underlying layer, an AlTiN layer, and a surface layer.

(Depositing the Underlying Layer)

Under conditions indicated in Table 2 for deposition, a reactant gas having a composition indicated in Table 2 was jetted onto a surface of the substrate to deposit an underlying layer of TiCN.

TABLE 2

| conditions for depositing underlying layer | |
|---|---|
| composition of reactant gas | $TiCl_4$ = 2.0 vol %, $CH_3CN$ = 0.7 vol %, $H_2$ = balance |
| temperature | 860° C. |
| pressure | 9 kPa |
| gas flow rate | 50.5 L/min |

(Depositing the AlTiN Layer)

Subsequently, for Samples 1 to 11, an AlTiN layer was deposited on the underlying layer. Depositing the AlTiN layer was divided into a first half and a second half by changing the first gas in type (i.e., the second step).

In the first half, under the conditions for deposition as indicated in Table 3 at the "conditions for depositing the AlTiN layer" column, the first gas specified in Table 8 at the "conditions for depositing the AlTiN layer," "1st half" and "1st gas (table 4)" column (see table 4 for the composition of the gas), the second gas having the composition indicated in Table 5, and the third gas having the composition indicated in Table 6 were jetted in this order repeatedly onto a surface of the underlying layer to deposit an AlTiN layer. The first half s deposition time is as indicated in Table 8 at the "conditions for depositing the AlTiN layer," "1st half" and "time (min.)" column.

Subsequently, in the second half, under the conditions for deposition as indicated in Table 3 at the "conditions for depositing the AlTiN layer" column, the first gas specified in Table 8 at the "conditions for depositing the AlTiN layer," "2nd half" and "1st gas (table 4)" column (see table 4 for the composition of the gas), the second gas having the composition indicated in Table 5, and the third gas having the composition indicated in Table 6 were jetted in this order repeatedly onto a surface of the underlying layer to deposit an AlTiN layer. The second half s deposition time is as indicated in Table 8 at the "conditions for depositing the AlTiN layer," "2nd half" and "time (min.)" column.

The substrate was set on a protrusion which the substrate setting jig was provided with. Furthermore, the gas jetting throughhole and the substrate were spaced by a sufficient distance (for example of 5 cm).

TABLE 3

| conditions for depositing AlTiN layer | |
|---|---|
| temperature | 780° C. |
| pressure | 3 kPa |
| rotational speed | 2 rpm |

TABLE 4

| composition of 1st gas | | | | | | | |
|---|---|---|---|---|---|---|---|
| ID no. | a | b | c | d | e | f | g |
| $AlCl_3$ (vol %) | 0.83 | 0.83 | 0.83 | 0.83 | 0.83 | 1.00 | 0.83 |
| $TiCl_4$ (vol %) | 0.17 | 0.17 | 0.17 | 0.17 | 0.17 | 0.00 | 0.17 |
| $AlCl_3/(AlCl_3 + TiCl_4)$ (molar ratio) | 0.83 | 0.83 | 0.83 | 0.83 | 0.83 | 1.00 | 0.83 |
| Ar (vol %) | 42 | 42 | 42 | 42 | 42 | 42 | 60 |
| CO (vol %) | 5.9 | 6.4 | 6.9 | 7.4 | 7.9 | 9 | 0 |
| $CO_2$ (vol %) | 5.9 | 6.4 | 6.9 | 7.4 | 7.9 | 9 | 0 |
| $CH_3OH$ (vol %) | 6.2 | 5.2 | 4.2 | 3.2 | 2.2 | 0 | 0 |
| $H_2$ (vol %) | balance | balance | balance | balance | balance | balance | balance |
| gas flow rate (L/min) | 18 | 18 | 18 | 18 | 18 | 18 | 20 |

TABLE 5

| composition of 2nd gas | |
|---|---|
| $AlCl_3$ (vol %) | 4.2 |
| $TiCl_4$ (vol %) | 0.7 |
| $AlCl_3/(AlCl_3 + TiCl_4)$ (molar ratio) | 0.86 |
| $NH_3$ (vol %) | 11 |
| Ar (vol %) | 16 |
| $H_2$ (vol %) | balance |
| gas flow rate (L/min) | 40 |

TABLE 6

| composition of 3rd gas | |
|---|---|
| $NH_3$ (vol %) | 2 |
| $H_2$ (vol %) | balance |
| gas flow rate (L/min) | 10 |

For example, for Sample 1 shown in Table 8, in the first half, with a temperature of 780° C., a pressure of 3 kPa, and the gas introduction pipe having a rotational speed of 2 rpm set as conditions for deposition (see Table 3), the first gas indicated in Table 4 by an identification number g ($AlCl_3$: 0.83% by volume, $TiCl_4$: 0.17% by volume, Ar: 60% by volume, $H_2$: balance, and gas flow rate: 20 L/min.), the second gas indicated in Table 5 ($AlCl_3$: 4.2% by volume, $TiCl_4$: 0.7% by volume, $NH_3$: 11% by volume, Ar: 16% by volume, $H_2$: balance, and gas flow rate: 40 L/min.), and the third gas indicated in Table 6 ($NH_3$: 2% by volume, $H_2$: balance, and gas flow rate: 10 L/min.) were jetted in this order repeatedly onto a surface of the substrate to deposit an AlTiN layer. The first half s deposition time was 590 minutes.

Subsequently, in the second half, for sample 1 indicated in table 8, with a temperature of 780° C., a pressure of 3 kPa, and the gas introduction pipe having a rotational speed of 2 rpm set as conditions for deposition (see Table 3), the first gas indicated in Table 4 by an identification number e ($AlCl_3$: 0.83% by volume, $TiCl_4$: 0.17% by volume, Ar: 42% by volume, CO: 7.9% by volume, $CO_2$: 7.9% by volume, $C_2H_5OH$: 2.2% by volume, $H_2$: balance, and gas flow rate: 18 L/min.), the second gas indicated in Table 5 ($AlCl_3$: 4.2% by volume, $TiCl_4$: 0.7% by volume, $NH_3$: 11% by volume, Ar: 16% by volume, $H_2$: balance, and gas flow rate: 40 L/min.), and the third gas indicated in Table 6 ($NH_3$: 2% by volume, $H_2$: balance, and gas flow rate: 10 L/min.) were jetted in this order repeatedly onto a surface of the substrate to deposit an AlTiN layer. The second half s deposition time was 10 minutes.

For sample 12, under the conditions for deposition as indicated in Table 3 at the "conditions for depositing the AlTiN layer" column, the first gas having the composition specified in table 4 by identification number g, the second gas having the composition specified in Table 5, and the third gas having the composition specified in Table 6 were jetted in this order repeatedly onto a surface of the underlying layer to deposit an $Al_2O_3$ layer. The deposition was done for 600 minutes.

For sample 13, under the conditions for deposition as indicated in Table 3 at the "conditions for depositing the AlTiN layer" column, the first gas having the composition specified in table 4 by an identification number f, the second gas having the composition specified in Table 5, and the third gas having the composition specified in Table 6 were jetted in this order repeatedly onto a surface of the underlying layer to deposit an Al$_2$O$_3$ layer. The deposition was done for 10 minutes.

(Depositing the Surface Layer)

Under conditions indicated in Table 7 for deposition, a reactant gas having a composition indicated in Table 7 was jetted onto a surface of the AlTiN layer to deposit a surface layer of TiN.

TABLE 7

| conditions for depositing surface layer | |
|---|---|
| composition of reactant gas | TiCl$_4$ = 0.5 vol %, N$_2$ = 41.2 vol %, H$_2$ = balance |

TABLE 7-continued

| conditions for depositing surface layer | |
|---|---|
| temperature | 780° C. |
| pressure | 79.8 kPa |
| gas flow rate | 45.9 L/min |

<Blasting>

The coating deposited on the substrate was blasted under the following conditions (a third step):
(Blasting Conditions)
Medium: 500 g of zirconia particles
Projection angle: 90°
Projection distance: 50 mm
Projection time: 3 seconds Through the above process, cutting tools were produced for samples 1 to 13 indicated in table 8.

TABLE 8

| | conditions for depositing AlTiN layer | | | | coating's composition & each layer's thickness | | | | |
|---|---|---|---|---|---|---|---|---|---|
| | 1st half | | 2nd half | | underlying layer | AlTiN layer | | surface layer | |
| sample nos. | 1st gas (table 4) | deposition time (min.) | 1st gas (table 4) | deposition time (min.) | composition (thickness: μm) | atomic ratio x of Al | (μm) | composition (thickness: μm) | total coating (μm) |
| 1 | g | 590 | e | 10 | TiCN(4.8) | 0.82 | 5.0 | TiN(0.2) | 10.0 |
| 2 | g | 590 | d | 10 | TiCN(4.8) | 0.82 | 5.0 | TiN(0.2) | 10.0 |
| 3 | g | 588 | c | 12 | TiCN(4.8) | 0.82 | 5.0 | TiN(0.2) | 10.0 |
| 4 | g | 575 | b | 25 | TiCN(4.8) | 0.81 | 5.0 | TiN(0.2) | 10.0 |
| 5 | g | 547 | d | 53 | TiCN(4.8) | 0.81 | 5.0 | TiN(0.2) | 10.0 |
| 6 | g | 592 | c | 8 | TiCN(4.8) | 0.82 | 5.0 | TiN(0.2) | 10.0 |
| 7 | g | 585 | d | 15 | TiCN(4.8) | 0.82 | 5.0 | TiN(0.2) | 10.0 |
| 8 | g | 579 | a | 21 | TiCN(4.8) | 0.82 | 5.0 | TiN(0.2) | 10.0 |
| 9 | g | 569 | b | 31 | TiCN(4.8) | 0.81 | 5.0 | TiN(0.2) | 10.0 |
| 10 | g | 562 | c | 38 | TiCN(4.8) | 0.81 | 5.0 | TiN(0.2) | 10.0 |
| 11 | g | 555 | d | 45 | TiCN(4.8) | 0.81 | 5.0 | TiN(0.2) | 10.0 |
| 12 | g | 600 | — | — | TiCN(4.8) | 0.82 | 5.0 | TiN(0.2) | 10.0 |
| 13 | (f) | (10) | — | — | TiCN(4.8) | no AlTiN layer (Al$_2$O$_3$ layer (5.0)) | | TiN(0.2) | 10.0 |

| | AlTiN layer's oxygen content ratio | | | | | | | |
|---|---|---|---|---|---|---|---|---|
| | 1st region | | 2nd region | | 3rd region | | | |
| | distance from 1st major | | distance from 1st major | | distance from 1st major | | cutting test | |
| sample nos. | surface (nm) | max. value (atom %) | surface (nm) | max. value (atom %) | surface (nm) | max. value (atom %) | distance (km) | damaged state |
| 1 | 5 | 3 | 60 | 28 | 104 | 2 | 3.6 | normally worn |
| 2 | 28 | 4 | 60 | 20 | 104 | 2 | 3.2 | normally worn |
| 3 | 28 | 3 | 32 | 7 | 104 | 2 | 3.2 | normally worn |
| 4 | 28 | 3 | 98 | 28 | 104 | 1 | 3.0 | normally worn |
| 5 | 28 | 3 | 60 | 25 | 104 | 4 | 3.0 | normally worn |
| 6 | 28 | 7 | 60 | 10 | 104 | 4 | 0.6 | boundary failure to breakage |
| 7 | 28 | 2 | 32 | 4 | 104 | 4 | 0.8 | boundary failure to breakage |
| 8 | 28 | 4 | 97 | 33 | 104 | 4 | 0.6 | boundary failure to breakage |
| 9 | 28 | 3 | 97 | 29 | 104 | 28 | 0.6 | boundary failure to breakage |
| 10 | 28 | 4 | 60 | 12 | 104 | 8 | 0.4 | boundary failure to breakage |
| 11 | 28 | 4 | 96 | 3 | 104 | 1 | 0.8 | boundary failure to breakage |
| 12 | — | 0 | — | 0 | — | 0 | 0.4 | boundary failure to breakage |

TABLE 8-continued

| 13 | no AlTiN layer | 2.2 | flank significantly worn |

<<Evaluating Characteristics of Cutting Tools>>

The cutting tools of samples 1 to 13 each underwent measurement of the thickness of each layer of the coating, the composition of the AlTiN layer, and the oxygen content ratio of the AlTiN layer.

<Thickness of Each Layer of Coating>

The underlying layer, the AlTiN layer, the surface layer, and the entire coating were measured in thickness with a scanning transmission electron microscope (STEM) (trade name: JEM-2100F, manufactured by JEOL Ltd.). How this measurement was specifically done will not be described as it has been described in the first embodiment. A result is shown in table 8, the "coating's composition and each layer's thickness" column, the "underlying layer," "AlTiN layer," "surface layer," and "total coating" subcolumns.

For example, Sample 1 had an underlying layer which was a 4.8 μm-thick TiCN layer, an AlTiN layer which was a 5.0 μm-thick layer, a surface layer which was a 0.2 μm-thick TiN layer, and a coating having a total thickness of 10.0 μm.

<Composition of AlTiN Layer>

The AlTiN layer was subjected to measurement of an atomic ratio x of Al in $Al_xTi_{1-x}N$ with an energy-dispersive-X-ray-analysis (EDX) device (SU9000® produced by Hitachi High-Tech Corporation) accompanying a scanning electron microscope (SEM). How this measurement was specifically done will not be described as it has been described in the first embodiment. A result is shown in table 8, the "coating's composition and each layer's thickness" column, the "atomic ratio x of Al" subcolumn.

<Oxygen Content Ratio of AlTiN Layer>

The AlTiN layer's oxygen content ratio was measured with an Auger electron spectrometer (device: PHI 650® produced by Perkin-Elmer). How this measurement was specifically done will not be described as it has been described in the first embodiment. A maximum oxygen content ratio in each of the first and second regions of the AlTiN layer and where it is measured (or a distance from a major surface) are indicated in Table 8 at the "AlTiN layer's oxygen content ratio" column.

For example, sample 1's AlTiN layer was measured, as follows: the first region had a maximum oxygen content ratio of 27 atomic % at a point having a distance of 27 nm from a major surface, and the second region had a maximum oxygen content ratio of 3 atomic % at a point having a distance of 103 nm from the major surface.

<<Cutting Test>>

(Cutting Evaluation: Interrupted Processing Test)

The cutting tools of samples 1 to 13 were used to perform light interrupted cutting of external diameter of forged skin of spheroidal graphite cast iron under the following cutting conditions. The processing conditions correspond to those under which boundary failure easily occurs. A cutting distance (in meters) reached when the flank was worn by an amount of 0.25 mm or the cutting edge portion was broken was measured. Moreover, how the cutting tools were damaged after cutting (i.e., a final damaged state) was observed. A result thereof is shown in table 8. A longer cutting distance indicates a longer tool life.

<Cutting Conditions>

Workpiece: FCD600 round bar
speed: 200 rpm/min.
Feed rate: 0.15 mm/t
Cutting amount: 1.5 mm
Cutting oil: Dry type <Discussions>

The cutting tools of samples 1 to 5 correspond to examples. The cutting tools of samples 6 to 13 correspond to comparative examples. It has been confirmed that the cutting tools of samples 1 to 5 (examples) had longer tool life than those of samples 6 to 13 (comparative examples).

In Samples 1 to 5, the AlTiN layer had the first region with a maximum oxygen content ratio of more than 0 atomic % and less than 5 atomic % and hence appropriate hardness and appropriate wear resistance, the second region with a maximum oxygen content ratio of 5 atomic % or more and 30 atomic % or less and hence excellent wear resistance and excellent oxidation resistance, which suppress boundary failure, and the third region with a maximum oxygen content ratio of more than 0 atomic % and less than 5 atomic % and hence appropriate hardness and appropriate wear resistance. The cutting tools of samples 1 to 5 can thus have a long tool life.

Sample 6 had boundary failure and breakage. It is believed that this is because in sample 6 the AlTiN layer had the first region with a maximum oxygen content of 7 atomic % and hence reduced hardness.

Sample 7 had boundary failure and breakage. It is believed that this is because in sample 7 the AlTiN layer had the second region with a maximum oxygen content ratio of 4 atomic % and hence reduced oxidation resistance.

Sample 8 had boundary failure and breakage. It is believed that this is because in sample 8 the AlTiN layer had the second region with a maximum oxygen content of 33 atomic % and hence reduced hardness.

Sample 9 had boundary failure and breakage. It is believed that this is because in sample 9 the AlTiN layer had the third region with a maximum oxygen content of 28 atomic % and hence reduced hardness.

Sample 10 had boundary failure and breakage. It is believed that this is because in sample 10 the AlTiN layer had the third region with a maximum oxygen content of 8 atomic % and hence reduced hardness.

Sample 11 had boundary failure and breakage. It is believed that this is because in sample 11 the AlTiN layer had the second region with a maximum oxygen content of 3 atomic % and hence reduced oxidation resistance.

Sample 11 had a flank worn and broken. It is believed that this is because in sample 11 the AlTiN layer had the first region with a maximum oxygen content of 0 atomic % and thus reduced in wear resistance and boundary breakage resistance, the second region with a maximum oxygen content ratio of 0 atomic % and thus reduced in oxidation resistance, and the third region with a maximum oxygen content of 0 atomic % and thus reduced in wear resistance and boundary breakage resistance.

Sample 12 had a flank significantly worn and thus had a short tool life. It is believed that this is because in sample 12 no AlTiN layer exists and an $Al_2O_3$ layer having low hardness exists.

While embodiments and examples of the present disclosure have been described as above, it is also planned from the beginning that the configurations of the above-described embodiments and examples are appropriately combined and variously modified.

The embodiments and examples disclosed herein are illustrative in any respects and should not be construed as being restrictive. The scope of the present invention is defined by the terms of the claims, rather than the above-described embodiments and examples, and is intended to include any modifications within the scope and meaning equivalent to the claims.

REFERENCE SIGNS LIST

1, 21, 31 cutting tool, 10 substrate, 11 AlTiN layer, 11a first major surface, 11b second major surface, 11A first region, 11B second region, 11C third region, 12 underlying layer, 13 surface layer, 14, 24, 34 coating, 50 CVD apparatus, 52 substrate setting jig, 53 reaction chamber, 54 temperature controller, 55 first gas introduction pipe, 56 second gas introduction pipe, 57 third gas introduction pipe, 58 gas introduction pipe, 59 gas exhaust pipe, 60 gas exhaust port

The invention claimed is:

1. A cutting tool comprising a substrate and an AlTiN layer disposed on the substrate, the AlTiN layer including cubic $Al_xTi_{(1-x)}N$ crystal grains, an atomic ratio x of Al in the $Al_xTi_{(1-x)}N$ being 0.7 or more and 0.95 or less, the AlTiN layer including a first major surface on a side of a surface of the cutting tool and a second major surface on a side of the substrate, the AlTiN layer including a first region having a distance of 0 nm or more and 30 nm or less from the first major surface, a second region having a distance of more than 30 nm and 100 nm or less from the first major surface, and a third region having a distance of more than 100 nm and 150 nm or less from the first major surface, the first region having a maximum oxygen content ratio of more than 0 atomic % and less than 5 atomic %, the second region having a maximum oxygen content ratio of 5 atomic % or more and 30 atomic % or less, the third region having a maximum oxygen content ratio of more than 0 atomic % and less than 5 atomic %.

2. The cutting tool according to claim 1, wherein the second region has a maximum oxygen content ratio of 6 atomic % or more and 30 atomic % or less.

3. The cutting tool according to claim 1, wherein the AlTiN layer has a thickness of 0.1 μm or more and 20 μm or less.

4. The cutting tool according to claim 1, further comprising an underlying layer disposed between the substrate and the AlTiN layer, wherein the underlying layer is composed of a first compound consisting of: at least one element selected from the group consisting of a group 4 element, a group 5 element and a group 6 element of the periodic table and Al; and at least one element selected from the group consisting of carbon, nitrogen, oxygen and boron.

5. The cutting tool according to claim 1, further comprising a surface layer disposed on the AlTiN layer, wherein the surface layer is composed of a second compound consisting of: at least one element selected from the group consisting of a group 4 element, a group 5 element and a group 6 element of the periodic table and Al; and at least one element selected from the group consisting of carbon, nitrogen, oxygen and boron.

* * * * *